(12) United States Patent
Park et al.

(10) Patent No.: US 7,781,346 B2
(45) Date of Patent: Aug. 24, 2010

(54) METHODS OF FORMING PATTERNS AND CAPACITORS FOR SEMICONDUCTOR DEVICES USING THE SAME

(75) Inventors: Cheol-Woo Park, Suwon-si (KR); Byoung-Moon Yoon, Suwon-si (KR); Yong-Sun Ko, Suwon-si (KR); Kyung-Hyun Kim, Seoul (KR); Kwang-Wook Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1012 days.

(21) Appl. No.: 11/455,815

(22) Filed: Jun. 20, 2006

(65) Prior Publication Data
US 2007/0059941 A1 Mar. 15, 2007

(30) Foreign Application Priority Data
Jun. 20, 2005 (KR) ...................... 10-2005-0052852

(51) Int. Cl.
*H01L 21/302* (2006.01)
(52) U.S. Cl. ...................... 438/706; 438/689; 438/704; 438/745; 257/E21.647
(58) Field of Classification Search ................. 438/689, 438/692, 704, 706, 745; 257/E21.647
See application file for complete search history.

(56) References Cited

U.S. PATENT DOCUMENTS

| | | | |
|---|---|---|---|
| 6,171,902 B1 | 1/2001 | Ida | |
| 6,500,763 B2 * | 12/2002 | Kim et al. | 438/689 |
| 6,700,153 B2 | 3/2004 | Oh et al. | |
| 2004/0058530 A1 * | 3/2004 | Ikegami | 438/680 |
| 2005/0287795 A1 * | 12/2005 | Torek et al. | 438/637 |

FOREIGN PATENT DOCUMENTS

| | | |
|---|---|---|
| KR | 10-1998-0005899 | 3/1998 |
| KR | 10-2000-0013446 | 3/2000 |
| KR | 10-2004-0008476 | 1/2004 |
| KR | 10-2004-0010871 | 2/2004 |
| KR | 10-2004-0090139 | 10/2004 |
| KR | 10-2005-0000908 | 1/2005 |

OTHER PUBLICATIONS

Korean Office Action dated June 30, 2006.

* cited by examiner

*Primary Examiner*—Thanh Nguyen
(74) *Attorney, Agent, or Firm*—Harness, Dickey & Pierce, P.L.C.

(57) ABSTRACT

A semiconductor structure may be formed by a wet etching process using an etchant containing water. The semiconductor structure may include a plurality of patterns having an increased or higher aspect ratio and may be arranged closer to one another. A dry cleaning process may be performed using hydrogen fluoride gas on the semiconductor structure.

10 Claims, 13 Drawing Sheets

US 7,781,346 B2

METHODS OF FORMING PATTERNS AND CAPACITORS FOR SEMICONDUCTOR DEVICES USING THE SAME

PRIORITY STATEMENT

This non-provisional patent application claims priority under 35 U.S.C. §119 to Korean Patent Application No. 10-2005-0052852 filed on Jun. 20, 2005, in the Korean Intellectual Property Office (KIPO) the entire contents of which are incorporated herein by reference.

BACKGROUND

1. Field of the Invention

Example embodiments of the present invention relate to methods of forming patterns and/or capacitors for semiconductor devices using the same. For example, at least one example embodiments of the present invention is directed to a method of forming semiconductor structures including a pattern having an increased and/or higher aspect ratio, and methods of forming a capacitor for a semiconductor device using the same.

2. Description of the Related Art

Related art dynamic random access memory (DRAM) devices may have a unit cell including an access transistor and a storage capacitor. Increased integration of semiconductor devices may require a smaller storage capacitor. Recent methods for manufacturing semiconductor devices have formed capacitors with larger storing capacitance and/or reduced size.

Capacitance C of a capacitor is expressed as the following equation (1).

$$C = \varepsilon_0 \varepsilon \frac{A}{d} \quad (1)$$

In the above equation (1), $\varepsilon_0$ represents a dielectric constant of a vacuum and $\varepsilon$ represents a dielectric constant of a dielectric layer of a capacitor. 'A' represents an effective surface area of a lower electrode and 'd' represents a thickness of the dielectric layer.

As shown in equation (1), storage capacitance of a capacitor may be directly proportional to an effective surface area of a lower electrode and a dielectric constant of a dielectric layer and may be inversely proportional to a thickness of a dielectric layer. Thus, according to the equation (1), an increase in the effective surface area of a lower electrode may be used for increasing the storage capacitance. For example, a lower electrode of a capacitor may be formed into a cylindrical shape having a larger height than width such that a surface area of the lower electrode is increased.

FIG. 1 is a cross sectional view illustrating a lower electrode of a related art capacitor for a semiconductor device. As shown, a plurality of cylindrical lower electrodes 16 may be formed on a semiconductor substrate 10. Each of the cylindrical lower electrodes 16 may have a larger height than width and may be arranged on the substrate close to each other. A cylindrical lower electrode 16 having a larger height than width may have a higher aspect ratio. An insulation interlayer 12 may be formed on the substrate 10 and a contact pad 14 may be formed into the insulation interlayer 12. The cylindrical lower electrode 16 may contact the contact pad 14.

A mold layer (not shown) having an opening may be used to form the cylindrical lower electrode 16. The mold layer having an opening may be formed on the substrate 10, and a thin layer may be formed (e.g., continuously formed) on a surface of the mold layer, sidewalls and bottom of the opening. The thin layer may be separated by a cell unit through a node separation process, and the mold layer may be completely removed from the substrate 10. The node-separated thin layer may be formed into a cylindrical lower electrode for a capacitor on the substrate 10.

A dry etching process may not sufficiently remove the mold layer from the substrate 10 because the mold layer may comprise oxide. In addition, a residual mold layer may remain on the substrate 10 even after the etching process. Accordingly, the mold layer may be removed from the substrate 10 by a wet etching process using an etchant containing water such as Limulus Amoebocyte Lysate (LAL) solution that is a mixture of ammonium fluoride ($NH_4F$), hydrogen fluoride (HF) and water ($H_2O$).

However, foreign matters 18 in FIG. 2 may accumulate between the cylindrical lower electrodes 16 when the mold layer is removed by a wet etching process. In particular, as shown in FIG. 2, when the foreign matters 18 accumulate between the cylindrical lower electrodes 16, the lower electrodes 16 may break and/or lean against each other and cause processing failures such as a two-bit failure. A two-bit failure is when two neighboring lower electrodes 16 make contact with each other. Foreign matters 18 may result from water in the etchant.

When a wet etching process for removing the mold layer from the substrate 10 is completed, water of the etchant may remain in the processing residuals distributed on a surface of the substrate 10. When the substrate experiencing the wet etching process is moved for a subsequent process, the water in the residuals may chemically react with air and oxidize resulting in the formation of the foreign matters between the cylindrical lower electrodes 16 on the substrate 10.

A cleansing process for removing the foreign matters 18 from the substrate 10 just before a dielectric layer is formed on the lower electrode 16 may be needed. An aqueous hydrogen fluoride (HF) solution may be used as a cleaning solution of the cleaning process. However, the foreign matters may still be found between the lower electrodes 16 despite the cleaning process because the water in the aqueous hydrogen fluoride (HF) solution may also create the foreign matters between the lower electrodes 16.

SUMMARY OF THE INVENTION

At least some example embodiments of the present invention provide an improved method of removing the foreign matters accumulated between semiconductor structures including patterns having increased and/or higher aspect ratios such as cylindrical lower electrodes.

At least some example embodiment of the present invention provide methods of forming patterns having increased and/or higher aspect ratios, wherein foreign matters may be suppressed (e.g., sufficiently prevented) from accumulating between the patterns, and reduce (e.g., prevent) patterns from being breaking and/or leaning due to the foreign matters. At least some example embodiments of the present invention provide methods for forming capacitors.

At least one example embodiment of the present invention provides a method of forming a pattern. A semiconductor structure may be formed by a wet etching process using an etchant containing water. The semiconductor structure may include a plurality of patterns having an increased and/or higher aspect ratio and may be arranged closer and/or closely to one another. A dry cleaning process using hydrogen fluoride gas may be performed on the semiconductor structure, so that foreign matters between the patterns by the water in the etchant may be removed from the pattern.

In at least some example embodiments, the semiconductor structure may include a cylindrical lower electrode. In at least some example embodiments, a pre-cleaning process and a dry process may be performed on the semiconductor structure before the dry cleaning process is performed. The dry process on the semiconductor structure may be performed in an isopropyl alcohol vapor atmosphere, thereby removing residual water from the semiconductor structure.

Another example embodiment of the present invention provides a method of forming a capacitor for a semiconductor device. A mold layer may be formed on a semiconductor substrate. The mold layer may include an opening through which the substrate may be at least partially exposed. A thin layer may be formed (e.g., continuously) on a surface of the mold layer, a sidewall of the opening and a top surface of the substrate exposed through the opening. A sacrificial layer may be formed on a resultant structure including the thin layer. The sacrificial layer and the thin layer may be removed (e.g., sequentially) until the surface of the mold layer is exposed, so that the sacrificial layer and the thin layer remain (e.g., exclusively or only remain) in the opening and the thin layer may be separated by a node of a unit cell of the semiconductor device. The mold layer and a residual sacrificial layer remaining in the opening may be removed (e.g., sequentially) by a wet etching process using an etchant containing water, thereby transforming the node-separated thin layer into a cylindrical lower electrode. A dry cleaning process may be performed on the substrate on which the cylindrical lower electrode is formed using hydrogen fluoride gas, so that foreign matters may be removed from the lower electrode. A dielectric layer may be formed on the lower electrode, and an upper electrode may be formed on the dielectric layer.

Another example embodiment of the present invention provides a method of forming a capacitor for a semiconductor device. A mold layer may be formed on a semiconductor substrate. The mold layer may include an opening through which the substrate may be at least partially exposed. A thin layer may be formed (e.g., continuously formed) on a surface of the mold layer, a sidewall of the opening and a top surface of the substrate exposed through the opening. A sacrificial layer may be formed on a resultant structure including the thin layer. The sacrificial layer and the thin layer are sequentially removed until the surface of the mold layer is exposed, so that the sacrificial layer and the thin layer remain (e.g., exclusively or only remain) in the opening and the thin layer may be separated by a node of a unit cell of the semiconductor device. A residual sacrificial layer remaining in the opening may be removed from the substrate, and the mold layer may be removed from the substrate by a wet etching process using an etchant containing water, thereby transforming the node-separated thin layer into a cylindrical lower electrode. A dry cleaning process may be performed on the substrate on which the cylindrical lower electrode is formed using hydrogen fluoride gas, so that foreign matters may be removed from the lower electrode. A dielectric layer may be formed on the lower electrode, and an upper electrode may be formed on the dielectric layer.

In at least some example embodiments of the present invention, a lower electrode may be formed by a wet etching process using an etchant containing water, and a dry cleaning process using hydrogen fluoride gas may be performed on a resultant structure including the lower electrode. Accordingly, foreign matters caused between the lower electrodes by water in the etchant may be sufficiently removed from the resultant structure due to the dry cleaning process in which no water is involved. Patterns having an increased and/or higher aspect ratio may be arranged more closely with each other with higher stability.

BRIEF DESCRIPTION OF THE DRAWINGS

The present invention will become readily apparent by reference to the following detailed description when considering in conjunction with the accompanying drawings, in which:

FIGS. 3A to 3I are cross sectional views illustrating a method of forming a capacitor for semiconductor devices according to an example embodiment of the present invention;

DETAILED DESCRIPTION OF EXAMPLE EMBODIMENTS OF THE PRESENT INVENTION

Figure 1:
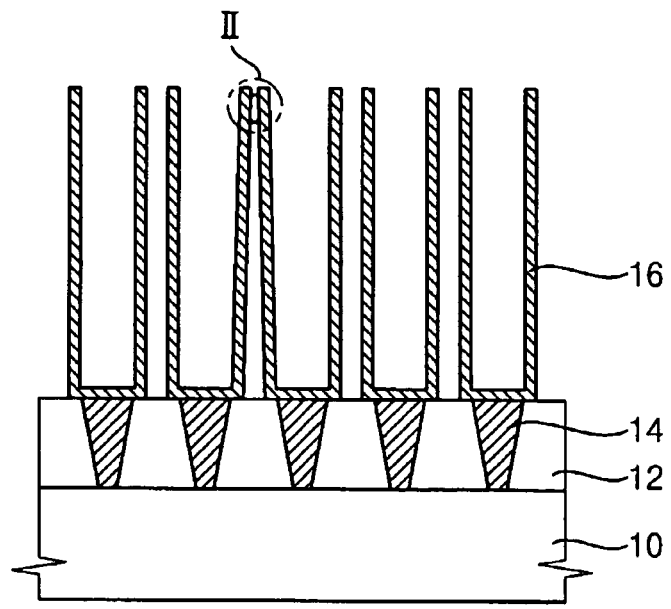
FIG. 1 is a cross sectional view illustrating a lower electrode of a conventional capacitor for a semiconductor device.
Figure 2:
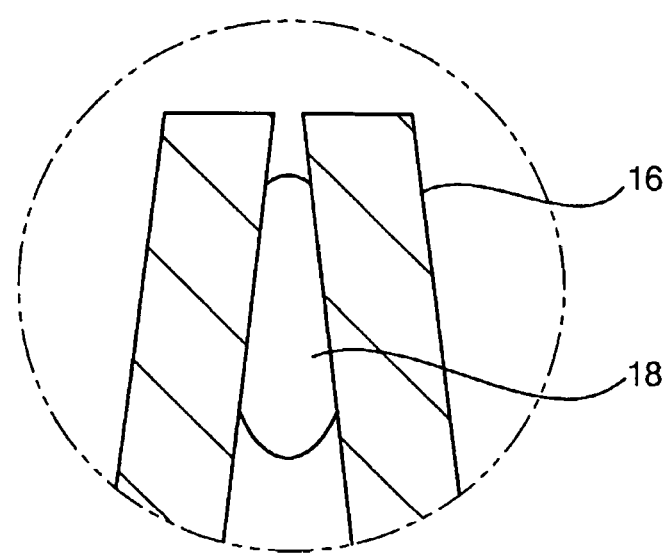
FIG. 2 is a partially enlarged view of a portion II in FIG. 1.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 3A to 3I are cross sectional views illustrating a method of forming a capacitor for semiconductor devices according to an example embodiment of the present invention.

Figure 3A:
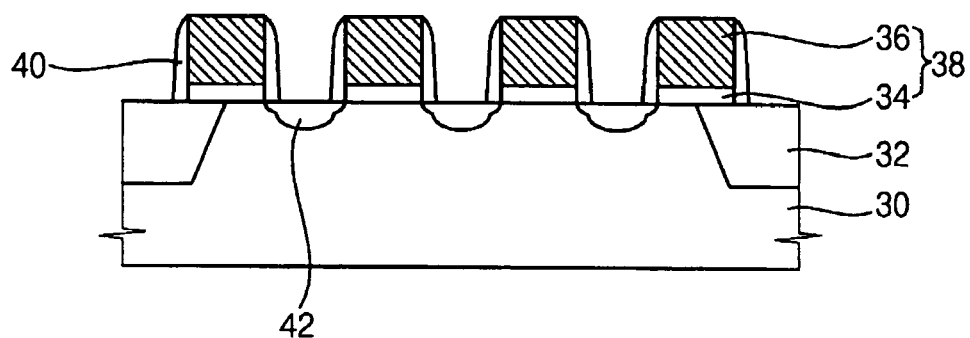

Referring to FIG. 3A, a device isolation layer 32 may be formed on a substrate 30 using any suitable device isolation process. In at least this example embodiment, a trench device isolation layer may be formed as a device isolation layer 32 in place of a field oxide layer. The trench device isolation layer may have a higher degree of integration. The device isolation layer 32 may partition the substrate 30 into an active region and a field region.

An insulation layer and a conductive layer may be formed (e.g., sequentially formed) on the substrate 30. Examples of the insulation layer include an oxide, a metal oxide, a metal oxynitride, or the like. These may be used alone or in combination with each other. For example, the metal oxide may have a smaller equivalent oxide thickness (EOT) and/or higher current leakage characteristics when applied to a semiconductor device. In at least this example embodiment, a metal oxide may be deposited onto the substrate 30 using chemical vapor deposition (CVD) or any other similar or substantially similar deposition process, thereby forming the insulation layer on the substrate 30. Examples of the conductive layer include polysilicon, a metal, a metal nitride, a metal silicide, or the like. These may also be used alone or in combination with each other.

When a gate conductive layer in a semiconductor device is formed into a multilayer structure, electrical characteristics of a device may be improved and the conductive layer in at least this example embodiment may have multiple layers including, for example, at least a metal layer and a metal nitride layer, or the like.

The insulation layer and the conductive layer may be patterned (e.g., sequentially patterned) to form a gate pattern 38 including a gate insulation pattern 34 and a gate conductive pattern 36 in the active region of the substrate 30. The patterning process may include, for example, an etching process using a photoresist pattern and/or a hard mask pattern including, for example, nitride as an etching mask. When the insulation layer and the conductive layer are etched using the hard mask pattern as an etching mask, the gate pattern 38 may further include a hard mask pattern (not shown) on the gate conductive pattern 36.

An ion implantation may be performed at surface portions of the substrate 30 using the gate pattern 38 as an implantation mask, so that a first doped junction area (e.g., a lighter or lightly-doped junction area) may be formed at the surface portions of the substrate 30 adjacent to the gate pattern 38. A spacer 40 comprising, for example, nitride may be formed on a sidewall of the gate pattern 38 by a deposition process and an etching process. Although discussed above as being formed of nitride, the spacer 40 may be formed of any suitable material.

An ion implantation may be (e.g., again) performed at the surface portions of the substrate 30 using the gate pattern 38 and the spacer 40 as an implantation mask, so that a second junction area (e.g., heavier or heavily-doped junction area) may be formed at the surface portions of the substrate 30 adjacent to the spacer 40. The second junction area may be more heavily-doped than the first junction area, and both the first and second junction areas may be formed at the surface portions of the substrate 30 adjacent to the gate pattern 38 and the spacer 40, thereby forming source/drain regions 42 on the substrate 30. The source/drain regions 42 may contact a lower electrode of a capacitor.

Figure 3B:
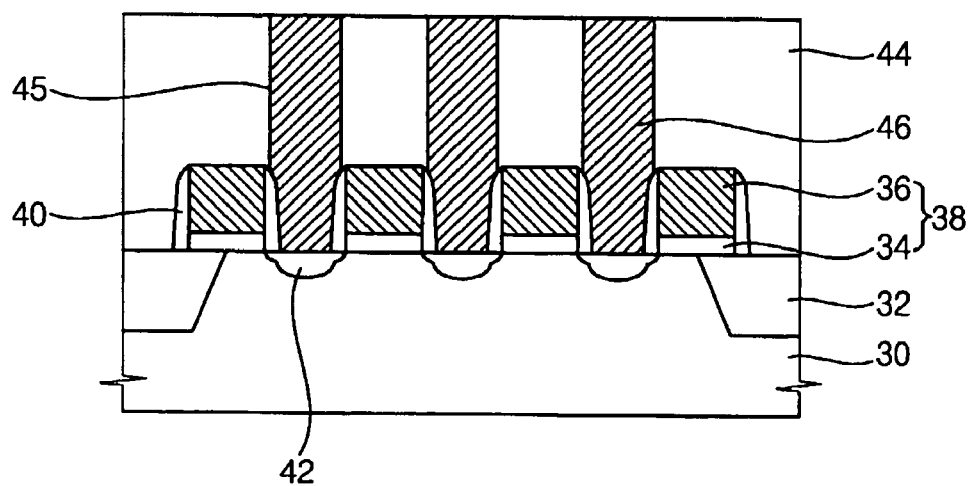

Referring to FIG. 3B, an insulation interlayer 44 may be formed on a substrate 30 including the gate pattern 38, and a first opening 45. A top surface of the source/drain regions may be formed in the insulation interlayer 44 and exposed by using a patterning or any other similar or substantially similar process. Conductive materials such as polysilicon, metal or any other material having similar or substantially similar conductive properties may be filled into the first opening 45 forming a contact pad 46. The contact pad 46 may contact a lower electrode of a capacitor. The contact pad 46 may be formed by a deposition process, a planarization process or any other suitable process. The planarization process may include, for example, a chemical mechanical polishing (CMP) process, an etching process and/or any other similar or substantially similar process against a whole top surface of a conductive layer.

In at least this example embodiment, the contact pad 46 may include a first plug formed between the gate patterns 38 and a second plug formed on the first plug.

FIGS. 3C to 3H illustrate a method of forming a cylindrical lower electrode making contact with the contact pad according to an example embodiment of the present invention.

Figure 3C:
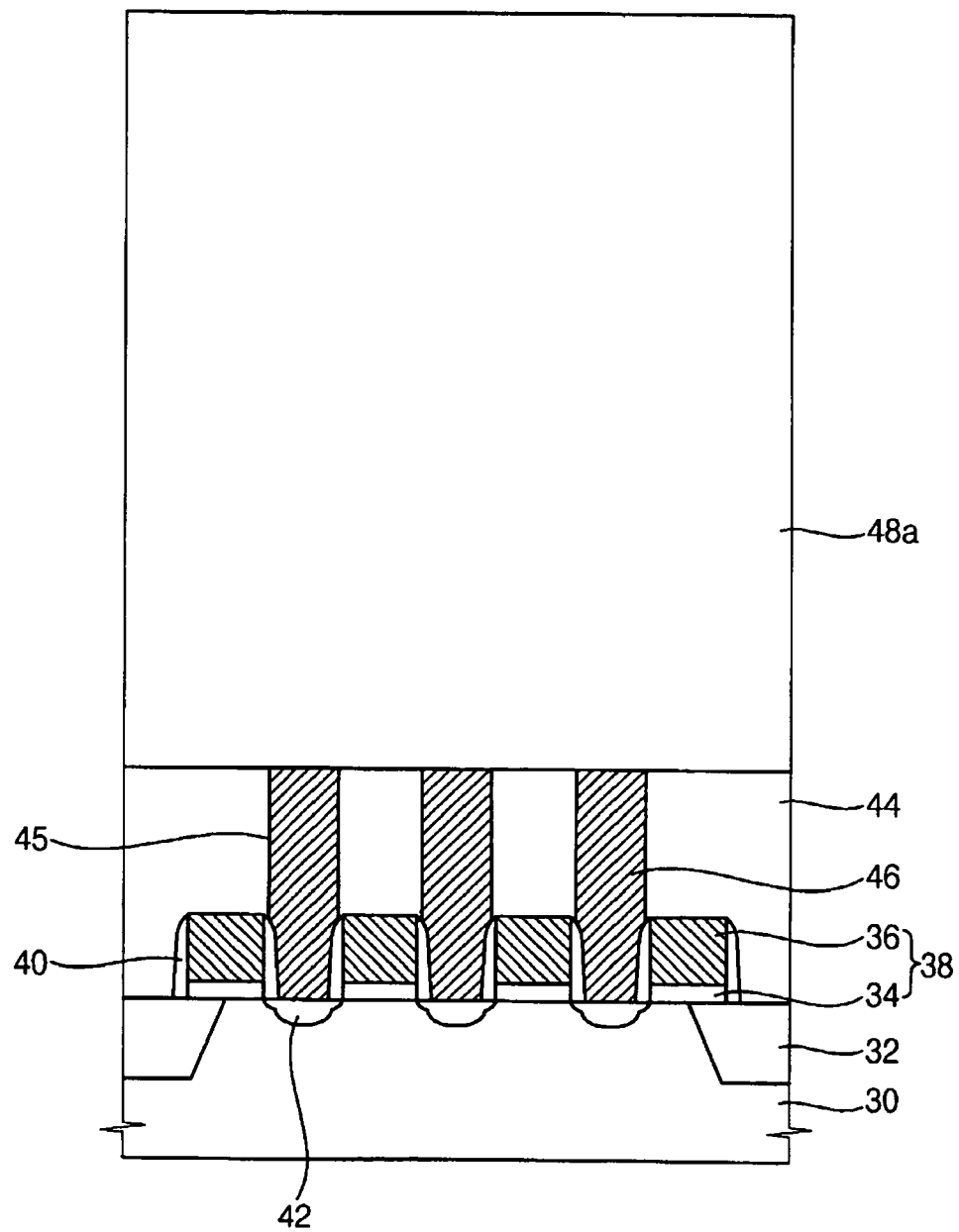

Referring to FIG. 3C, a preliminary mold layer 48a may be formed on the insulation interlayer 44 including the opening 46. In at least this example embodiment, the preliminary mold layer 48a may comprise an oxide, or any other similar or substantially similar element or material, and may be formed by a CVD, or any other similar or substantially similar deposition process. A height of the preliminary mold layer 48a may be determined based on a height of a lower electrode of a capacitor. For example, the preliminary mold layer 48a may be formed to a height of about 1.65 μm and the lower electrode may have a height of about 1.65 μm.

Figure 3D:
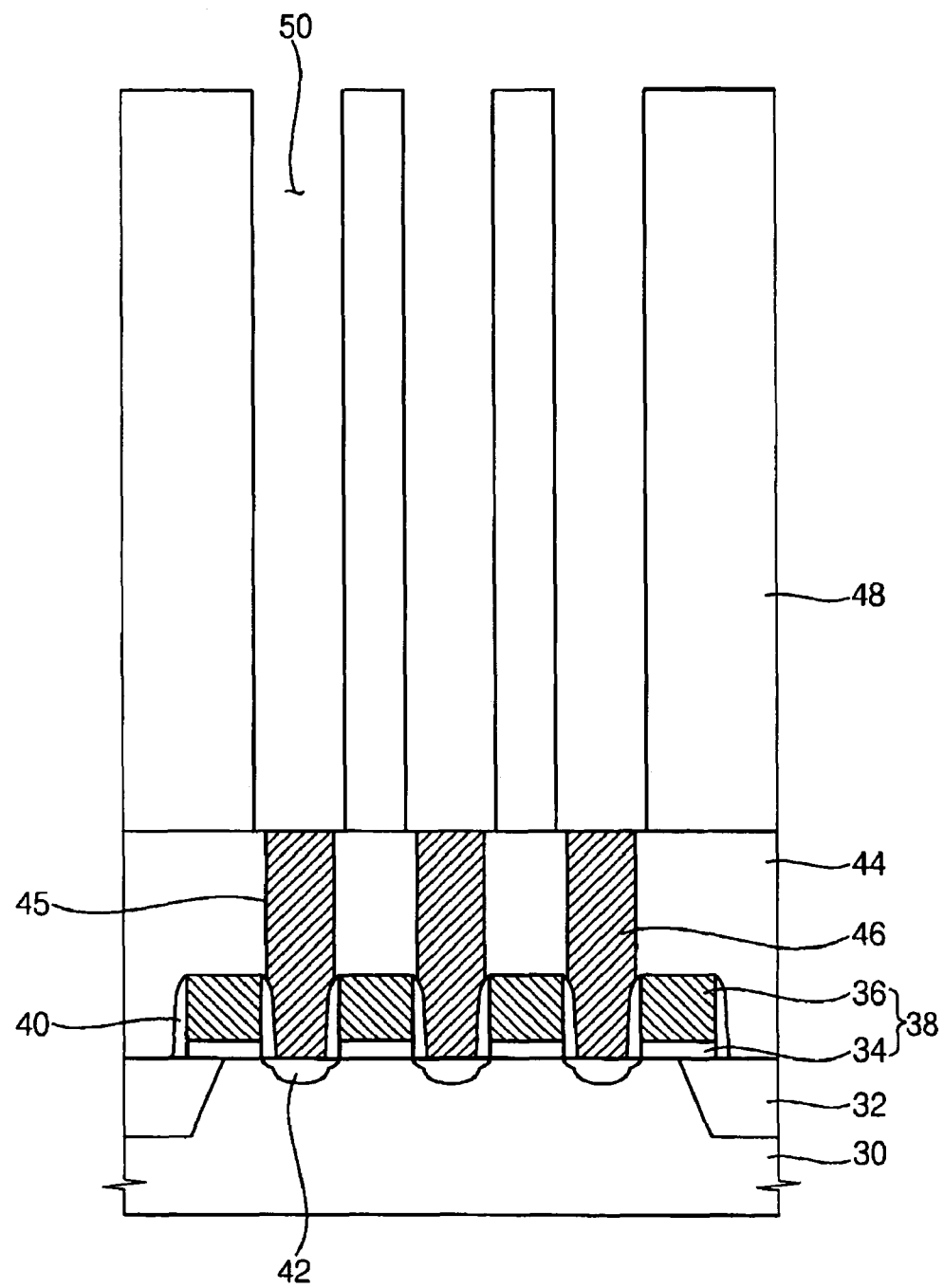

The preliminary mold layer 48a may be patterned by a photolithography or any other similar or substantially similar process to forming a second opening 50 through which the contact pad 46 may be exposed. For example, a photoresist layer (not shown) may be formed on the preliminary mold layer 48a. The photoresist layer may be partially removed to form a photoresist pattern on the preliminary mold layer 48a. In at least this example, the preliminary mold layer 48a may be partially etched away using the photoresist pattern as an etching mask until a top surface of the contact pad 46 may be exposed. A mold layer 48 having an second opening 50 may be formed on the substrate 30 and the contact pad 46 may be exposed through the second opening 50, as shown in FIG. 3D.

Figure 3E:
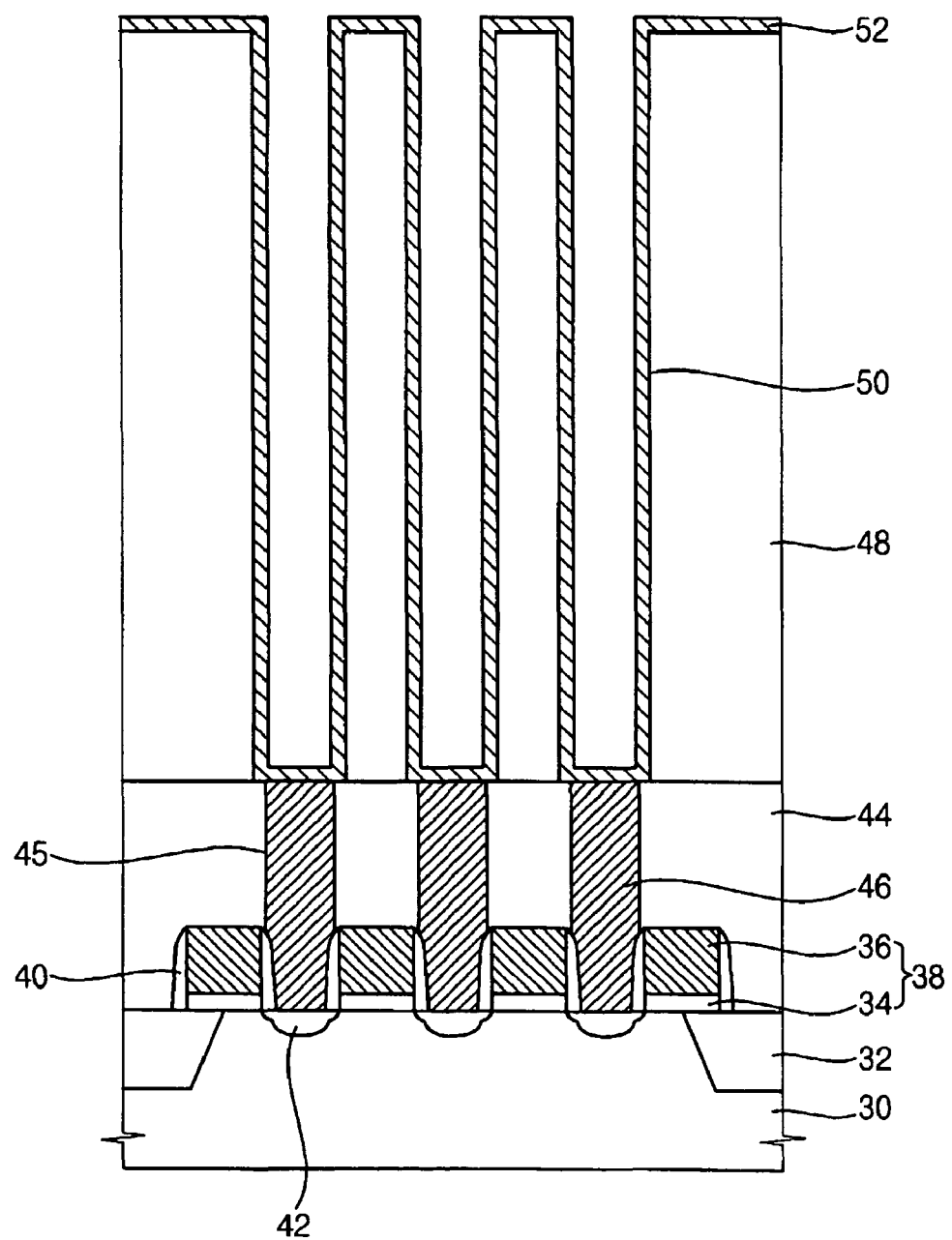

Referring to FIG. 3E, a thin layer 52 may be formed on a top surface of the mold layer 48, a sidewall of the second opening 50 and a top surface of the contact pad 46 exposed through the second opening 50. The thin layer 52 may comprise polysilicon, metal, metal nitride, a combination thereof or any other similar or substantially similar material. In at least this example embodiment, the thin layer 52 may comprise metal nitride, which may have a higher degree of integration as compared to polysilicon and/or metal.

For example, titanium nitride may be deposited onto the a top surface of the mold layer 48, the sidewall of the second opening 50 and the top surface of the contact pad 46 exposed through the second opening 50 using a chemical vapor deposition (CVD) to form a titanium nitride layer on the top surface of the mold layer 48, the sidewall of the second opening 50 and the top surface of the contact pad 46 exposed through the second opening 50 as the thin layer 52. In at least one example embodiment, the CVD process may be performed at a temperature below about 550° C. using a source gas including titanium tetrachloride ($TiCl_4$) gas and ammonia ($NH_3$) gas.

The thin layer 52 may be formed by an atomic layer deposition (ALD) process, a sputtering process or any other similar or substantially similar process. An ALD process may be less productive, and the sputtering process may have less step coverage. When the thin layer 52 may be formed to a thin thickness, the ALD process may be performed in place of the CVD process.

Figure 3F:
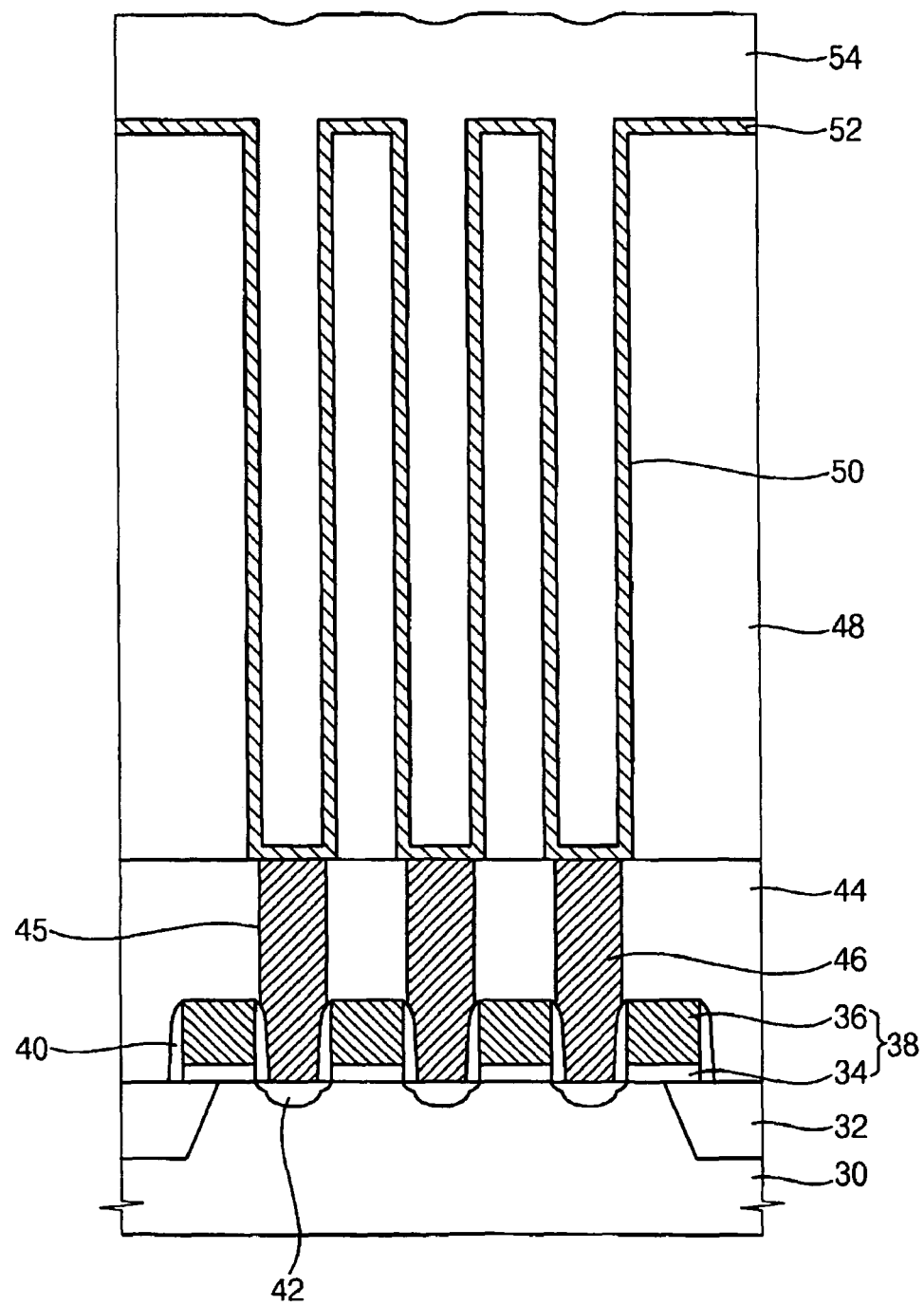

Referring to FIG. 3F, a sacrificial layer 54 may be formed on a resultant structure including the thin layer 52 to a thickness sufficient to fill the second opening 50. In at least this example, the sacrificial layer 54 has the same or substantially the same etching rate as that of the mold layer 48, so that the sacrificial layer 54 may comprise an oxide. The sacrificial layer 54 may also comprise a photoresist composition.

Figure 3G:
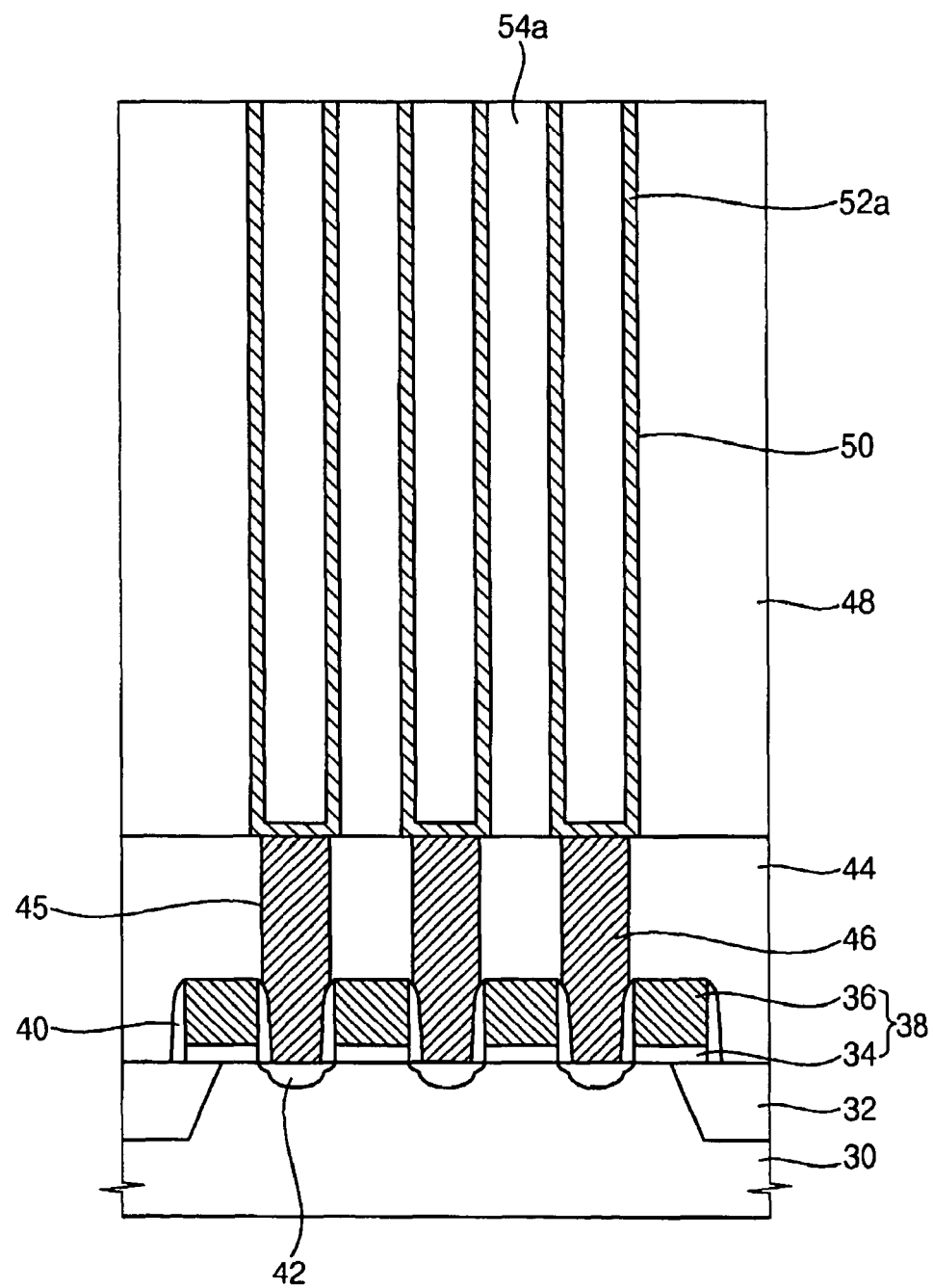

The sacrificial layer 54 and the thin layer 52 may be removed (e.g., sequentially removed) from the mold layer 48 by a chemical mechanical polishing (CMP) process, an etching process or any other similar or substantially similar removal process against the surface of the sacrificial layer 54, so that the thin layer and the sacrificial layer 54 may remain (e.g., only or exclusively remain) in the second opening 50. The thin layer 52 may be separated by a unit cell of a memory device to thereby complete a node separation, as shown in FIG. 3G. Hereinafter, the thin layer in the second opening 50 is referred to as node-separated thin layer 52a, and the sacrificial layer in the second opening 50 is referred to as a residual sacrificial layer 54a.

Figure 3H:
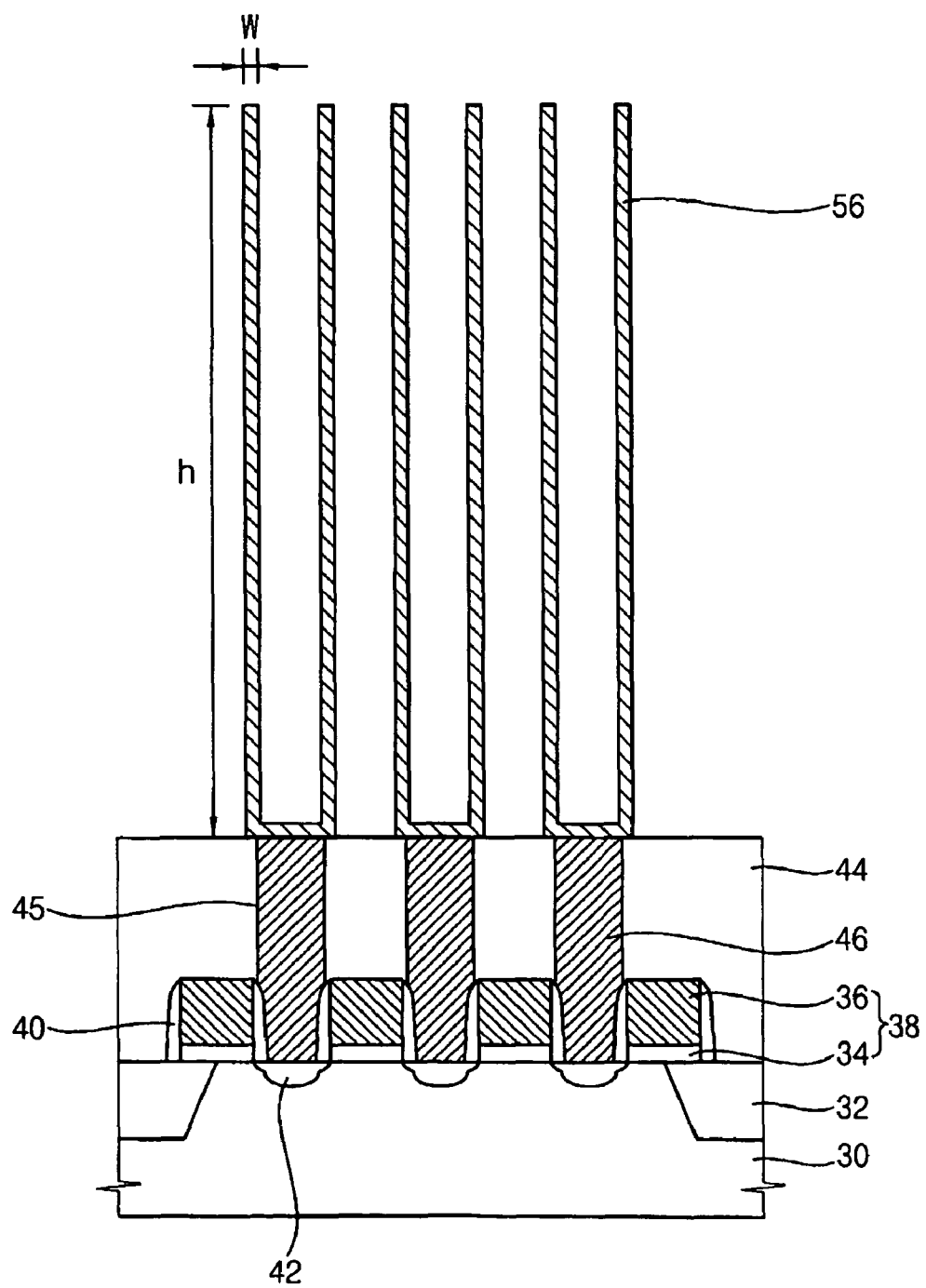
Figure 31:
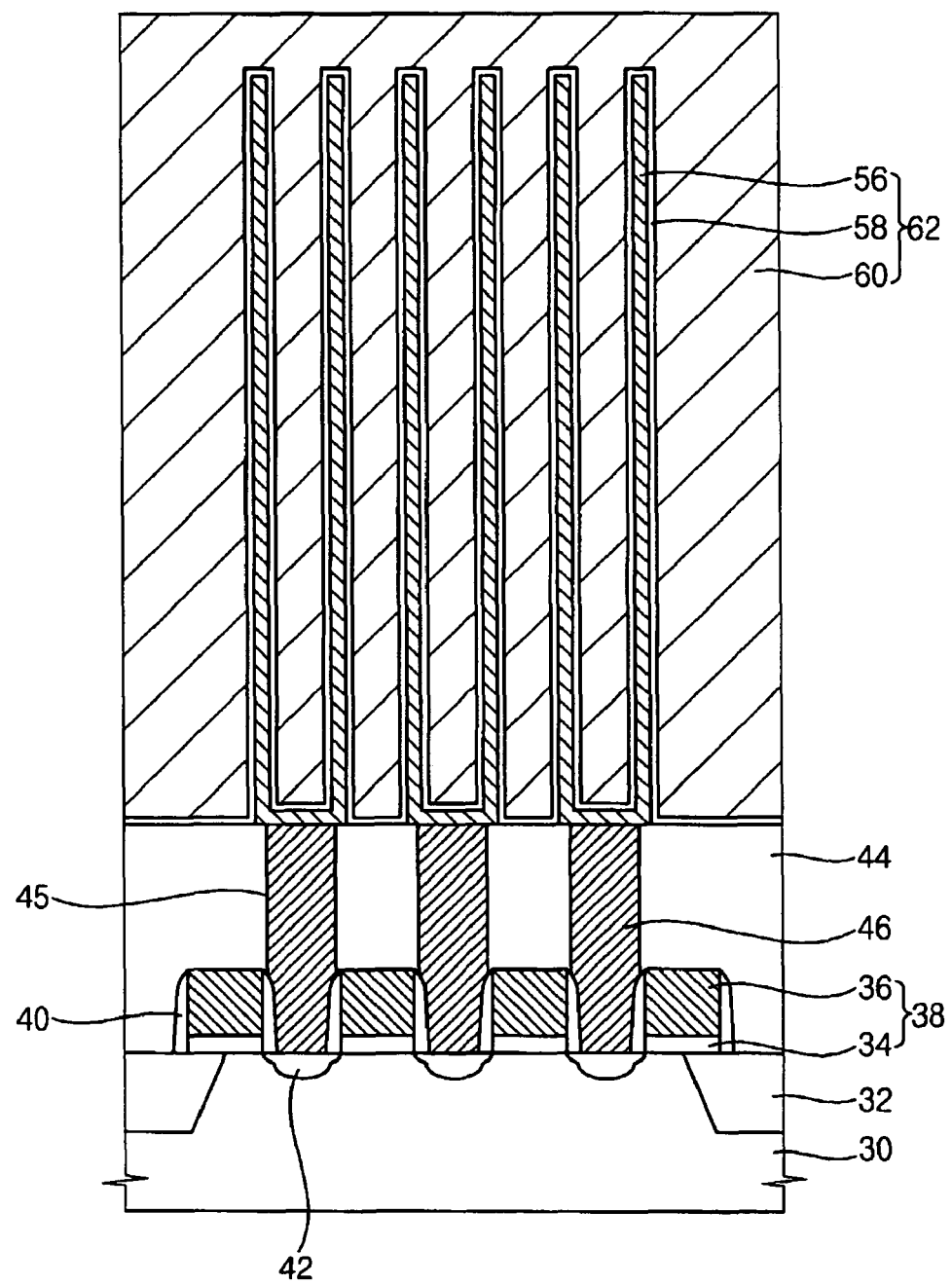

Referring to FIG. 3H, the mold layer 48 and the residual sacrificial layer 54a may be removed from the substrate 30, so that a plurality of cylindrical lower electrodes 56, each of which may contact the contact pad 46, may be formed on the substrate 30. For example, the node-separated thin layer 52a may be formed into the cylindrical lower electrode 56 by removing the mold layer 48 and the residual sacrificial layer 54a. The lower electrode 56 may have an increased or higher aspect ratio and each of the lower electrodes 56 may be arranged closer to one another on the contact pad 46.

In at least this example, the lower electrode 56 may have an aspect ratio of about 8 to about 12, inclusive. For example, the cylindrical lower electrode 56 may have a height of about 1.65 μm and a width of about 0.20 μm. The mold layer 48 and the residual sacrificial layer 54a may comprise an oxide so that the mold layer 48 and the residual sacrificial layer 54a may be removed (e.g., simultaneously removed) from the insulation interlayer 44 by a wet etching or any other similar or substantially similar process. The wet etching process may use, for example, a Limulus Amoebocyte Lysate (LAL) solution. The LAL solution is a mixture of ammonium fluoride ($NH_4F$), hydrogen fluoride (HF) and water. When the substrate 30 including the mold layer 48 and the residual sacrificial layer 54a is dipped into the LAL solution contained in an etching bath, the mold layer 48 and the residual sacrificial layer 54a may be removed from the insulation interlayer 44.

After the above dipping process, a cleaning process may be performed on the substrate 30 to remove a residual LAL solution from a resultant structure including the lower electrode. For example, a pre-cleaning process using water may be performed before (e.g., immediately or just before) the cleaning process so as to improve a cleaning efficiency. The pre-cleaning process may be performed using quick dumped rinse (QDR) or any other similar or substantially similar process.

Figure 4:
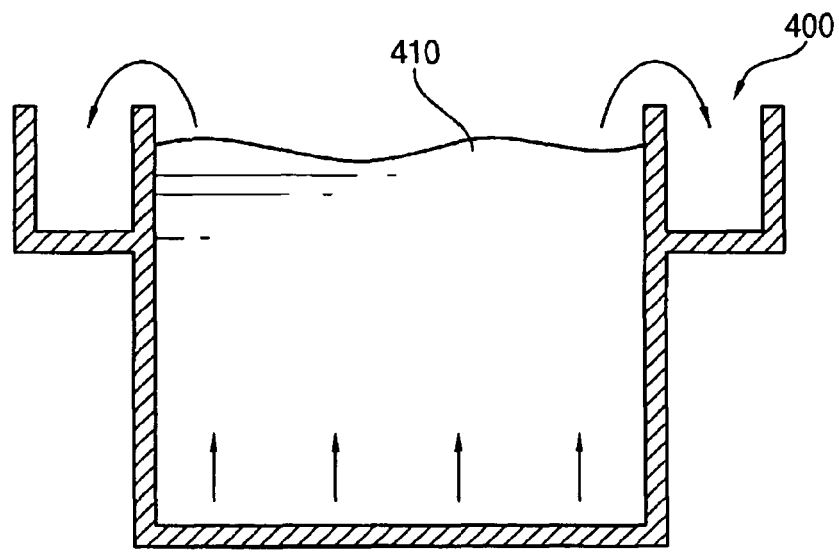
FIG. 4 is structural view illustrating a pre-cleaning bath for pre-cleaning a substrate including a lower electrode, according to an example embodiment of the present invention.

For example, as shown in FIG. 4, water 410 for the pre-cleaning process may be contained in a reservoir and may overflow into a subsidiary bath 400. Water may be supplied from a bottom portion of the reservoir and fill (e.g., gradually fill) the reservoir. When the reservoir is fill of water, water may overflow into the subsidiary bath 400 from a top portion of the reservoir, and overflowed water may be stored in the subsidiary bath 400. The resultant structure including the lower electrode 46 may be dipped into the subsidiary bath 400 and may be rinsed by water in the subsidiary bath 400.

After the cleaning process for removing the residual LAL solution from the substrate 30, the resultant structure including the cylindrical lower electrode 56 may undergo a drying process. When cleaning solution remains on the resultant structure including the lower electrode 56, water in the cleaning solution may remain between neighboring lower electrodes 56 and the surface tension of the water may attract the neighboring lower electrodes 56 to each other so that the neighboring lower electrodes 56 may break and/or lean against each other. The resultant structure including the lower electrode 56 may need to undergo the drying process so as to remove the remaining cleaning solution from the resultant structure.

Figure 5:
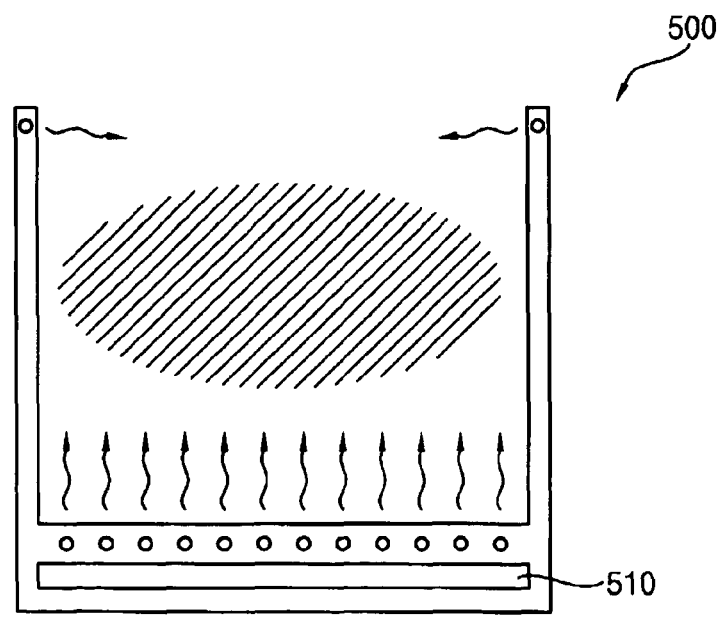
FIG. 5 is structural view illustrating a processing chamber for drying a substrate including a lower electrode in an isopropyl alcohol vapor atmosphere, according to an example embodiment of the present invention.

In at least one example embodiment, the drying process may be performed in an isopropyl alcohol vapor atmosphere. In at least this example, the isopropyl alcohol vapor may be created by evaporating isopropyl alcohol in a processing chamber. For example, as shown in FIG. 5, a heater 510 may be positioned at a bottom portion of the processing chamber 500, and the isopropyl alcohol may be heated and evaporated at the bottom portion of the processing chamber 500. When the processing chamber 500 is filled (e.g., sufficiently filled) with the isopropyl alcohol vapor, the resultant structure including the lower electrode 56 to be cleaned may be loaded into the processing chamber 500. When the resultant structure including the lower electrode 56 undergoes the dry process in an isopropyl alcohol vapor atmosphere, the isopropyl alcohol vapor may be substituted for the cleaning solution remaining on the resultant structure. As a result, the cleaning solution may be removed (e.g., completely removed) from the resultant structure over time.

According to at least this example embodiment, the mold layer 48 and the residual sacrificial layer 54a may be removed from the insulation interlayer 44 by a wet etching process using an etchant containing cleaning solution such as water, LAL solution or the like. As a result, foreign matters may accumulate between the lower electrodes 56. When a wet etching process for removing the mold layer from the resultant structure including the lower electrode 56 is completed, remnants of the etchant may remain in the processing residuals distributed on a surface of the resultant structure including the lower electrode 56. When the resultant structure including the lower electrode 56 experiencing the wet etching process is moved for a subsequent process, the water in the residuals may chemically react with air and oxidize to form foreign matters between the lower electrodes 56 on the resultant structure.

For example, the pre-cleaning process using water may be performed on the resultant structure including the lower electrode 56, so a larger amount of the foreign matters may be generated between the lower electrodes 56 of the resultant structure. A dry cleaning process may be performed on the resultant structure including the lower electrode 56 using a cleaning gas such as, for example, hydrogen fluoride gas before a dielectric layer may be formed on the lower electrode 56 in a subsequent process, thereby removing the foreign matters from the resultant structure including the lower electrode 56. The dry cleaning process may be performed on the resultant structure including the lower electrode 56 after completing the drying process, so the foreign matters may be removed (e.g., completely removed) from the resultant structure including the lower electrode 56. The dry cleaning process may be repeated any number of times before (e.g., immediately or just before) the dielectric layer is formed on the lower electrode 56.

For example, a first dry cleaning process may be performed after (e.g., immediately after) the mold layer 48 and the residual sacrificial layer 54a are removed from the insulation interlayer 44, and a second dry cleaning process may be performed after (e.g., immediately after) the pre-cleaning process is performed on the resultant structure including the lower electrode 56. A third dry cleaning process may be performed after (e.g., immediately after) the dry process is performed on the resultant structure including the lower electrode 56. A single repetition of the dry cleaning process may be sufficient to remove the foreign matters satisfactorily in spite of the pre-cleaning process and the dry process. The dry cleaning process may be performed after (e.g., immediately after) the mold layer 48 and the residual sacrificial layer 54a are removed from the insulation interlayer 44 irrespective of the pre-cleaning process and/or the drying process.

In at least one example embodiment, the foreign matters may be removed from the resultant structure including the lower electrode 56 by a dry cleaning process using, for example, hydrogen fluoride gas before the dielectric layer is formed on the lower electrode 56. Although hydrogen fluoride gas is discussed herein, any other suitable gas may be used. The foreign matters may be suppressed (e.g., prevented) from re-accumulating between the cylindrical lower electrodes 56 in the cleaning process. As a result, the cylindrical lower electrodes 56 may be suppressed (e.g., prevented) from breaking and/or leaning against to each other due to the foreign matters.

Referring to FIG. 3I, a dielectric layer 58 may be formed on a top surface of the resultant structure including the lower electrode 56 along a contour thereof. The dielectric layer 58 may include a metal oxide layer, a multilayer such as an oxide-nitride layer and/or an oxide-nitride-oxide layer or any other similar or substantially similar material or combinations of materials. The metal oxide layer may have improved current leakage characteristics despite having a smaller equivalent oxide thickness (EOT). A metal oxide layer may be used as the dielectric layer 58 in at least this example embodiment of the present invention. In at least this example, the dielectric layer 58 may be formed using ALD.

The ALD process for forming the dielectric layer 58 may include providing source material, removing a residual source material, providing an oxidizing agent, removing a residual oxidizing agent, performed sequentially, and may constitute a cycle of the ALD process. The number of repetitions of the cycle may determine a thickness of the dielectric layer 58. In at least one example embodiment, the cycle may be repeated at least once, so the dielectric layer 58 comprising metal oxide may be formed on the lower electrode 56. The source material may include a metal precursor, and the source material may include, for example, tetrakis ethyl methyl amino hafnium (TEMAH, $Hf[NC_2H_5CH_3]_4$) or hafnium butyl oxide ($Hf(O\text{-}tBu)_4$) when a hafnium precursor is used in the ALD process, and includes trimethyl aluminum (TMA, $Al(CH_3)_3$) when an aluminum precursor is used in the ALD process. Examples of the oxidizing agent include ozone ($O_3$), vapor ($H_2O$), non-activated oxygen ($O_2$), oxygen ($O_2$) activated by plasma or remote plasma, etc. These may be used alone or in combination with one another.

For example, when the dielectric layer 58 comprises hafnium oxide, the ALD process for forming the dielectric layer 58 may include providing a source material (e.g., TEMAH), removing a residual source material, providing ozone ($O_3$) gas and removing a residual oxidizing agent. The preceding cycle of the ALD process may be repeated at least once.

An upper electrode 60 may be formed on a resultant structure including the dielectric layer 58. The upper electrode 60 may have the same or substantially the same structure as the lower electrode 56, so that the upper electrode 60 may comprise polysilicon, metal, metal nitride, any other similar or substantially similar material or combination of materials. In at least one example embodiment, a metal nitride may be used to form the upper electrode 60. Metal nitride may have a higher degree of integration than polysilicon and/or metal, and may be deposited onto the dielectric layer 58 using CVD or any other similar or substantially similar process to form the upper electrode 60. In at least this example embodiment, titanium nitride may be deposited onto the dielectric layer 58 by a CVD process using titanium tetrachloride (TiCl$_4$) gas and ammonia (NH$_3$) gas as a source gas at a temperature of less than or equal to about 550° C. to form the upper electrode 60 on the dielectric layer 58.

A capacitor 62 including the lower electrode 56, the dielectric layer 58 and/or the upper electrode 60 may be formed on the substrate 30. For example, the lower electrode 56 may be formed into a cylindrical shape, so that a capacitance of the capacitor 62 may be improved. Foreign matters between the lower electrodes 56, which may be caused by water contained in the etchant such as an LAL solution, may be removed (e.g., sufficiently removed) by a dry cleaning process using, for example, hydrogen fluoride gas. This may improve stability of the lower electrodes 56 of the capacitor 62.

Figure 6A:
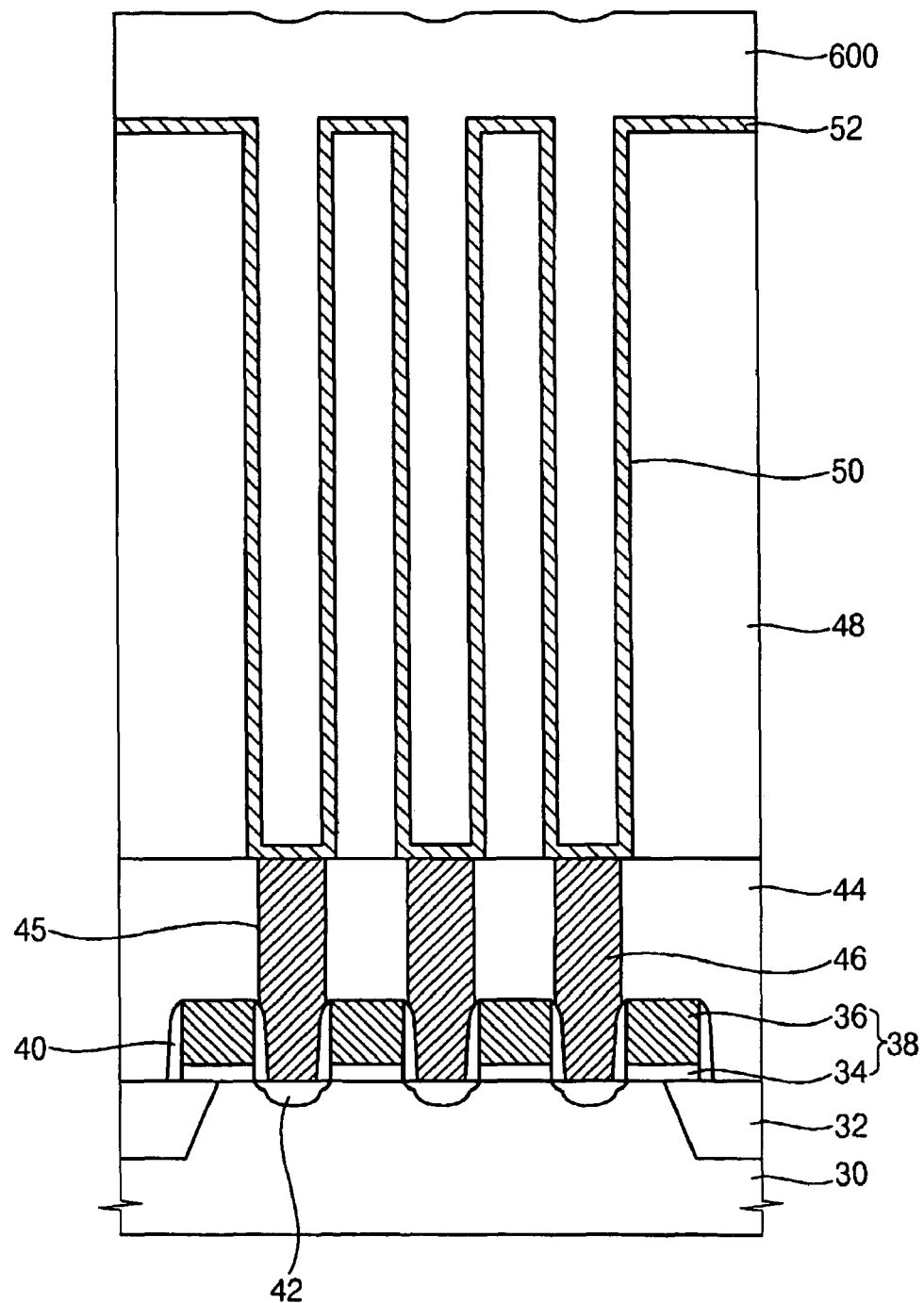
FIGS. 6A to 6C are cross sectional views illustrating a method of forming a capacitor for semiconductor devices according to another example embodiment of the present invention.
Figure 6B:
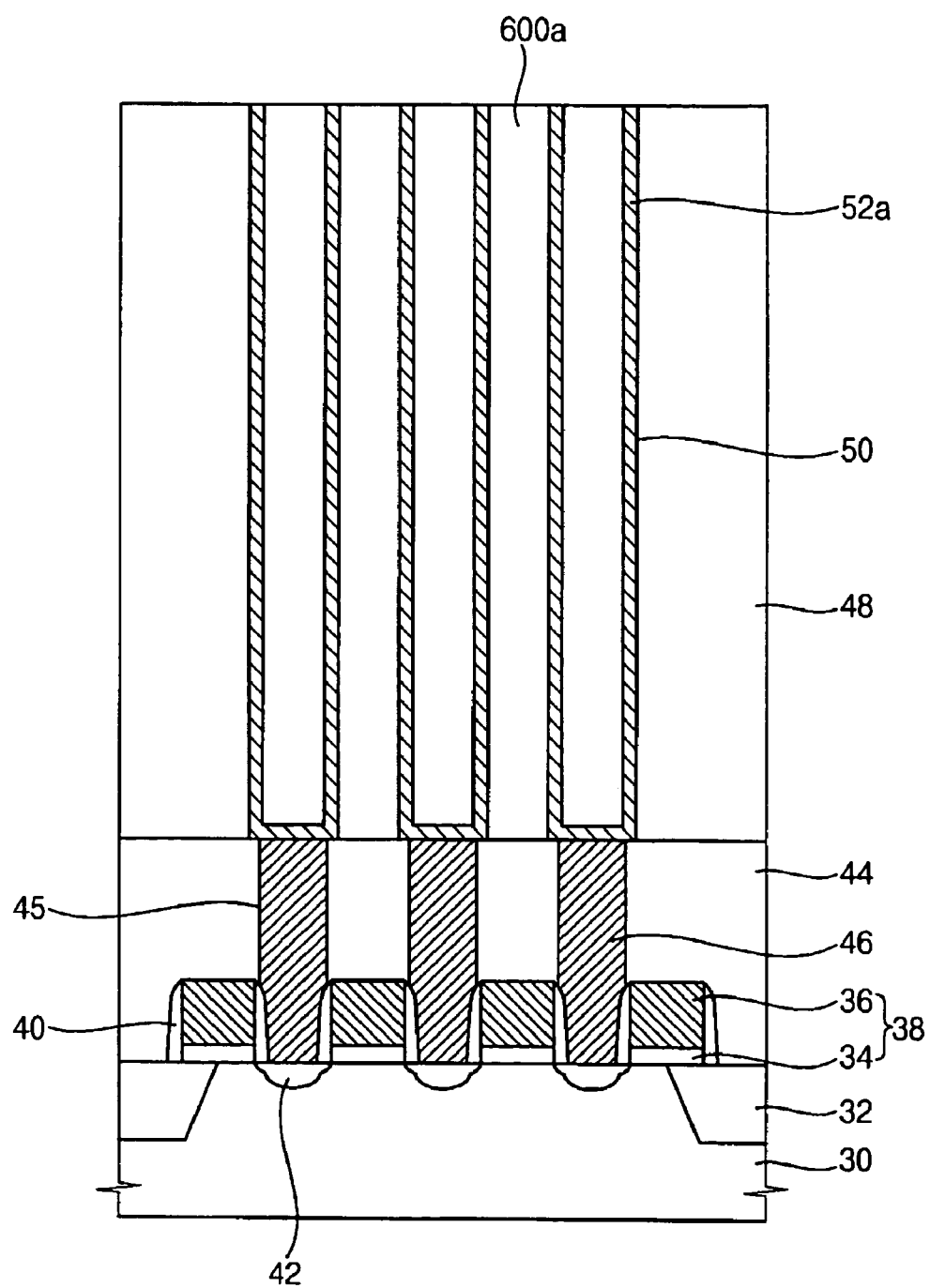
Figure 6C:
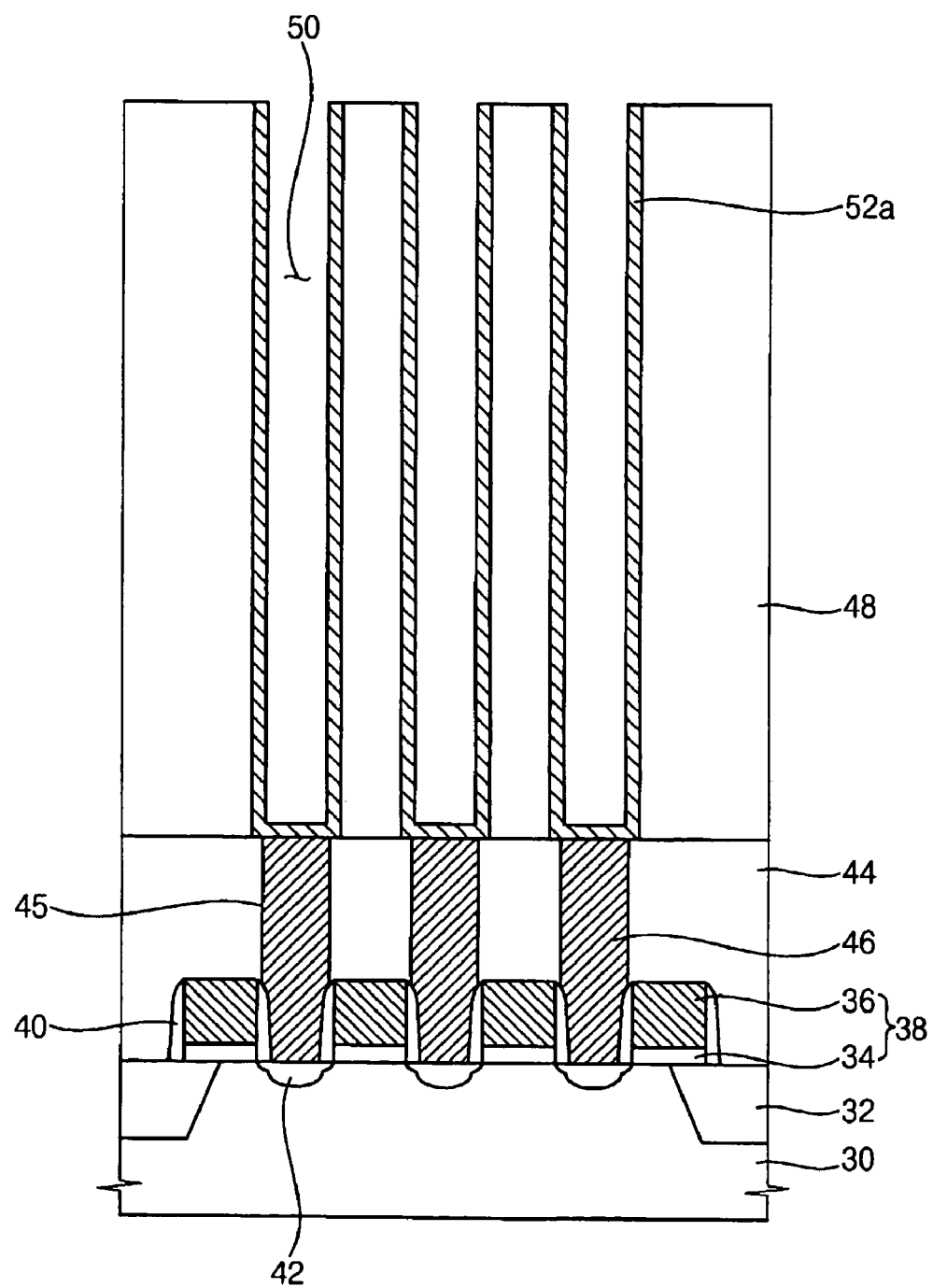

FIGS. 6A to 6C are cross sectional views illustrating a method of forming a capacitor for a semiconductor device according to another example embodiment of the present invention. The capacitor in at least this example embodiment may be similar or substantially similar to that as discussed above except for the sacrificial layer. Additionally, the method as illustrated in FIGS. 6A to 6C may be the same or substantially the same as the method shown in FIGS. 3A to 3E so as to form a dielectric layer of a capacitor according to an example embodiment of the present invention.

Referring to FIG. 6A, a sacrificial layer 600 may be formed on a resultant structure including the thin layer 52, and may be formed to a thickness sufficient to fill up the second opening 50. The sacrificial layer 600 may have an etching rate different from that of the mold layer 48, and may comprise a photoresist composition.

The sacrificial layer 600 and the thin layer 52 may be removed (e.g., sequentially removed) from the mold layer 48 by a chemical mechanical polishing (CMP) process, an etching process or any similar or substantially similar process against a surface of the sacrificial layer 600, so that the thin layer 52 and the sacrificial layer 600 remains (e.g., exclusively or only remains) in the second opening 50. The thin layer 52 may be separated by a unit cell of a memory device to thereby complete node separation, as shown in FIG. 6B. Hereinafter, the thin layer in the second opening 50 is referred to as node-separated thin layer 52a and the sacrificial layer 600 in the second opening 50 is referred to as a residual sacrificial layer 600a.

Referring to FIG. 6C, the residual sacrificial layer 600a may be removed from the substrate 30 by an ashing process using, for example, oxygen gas activated by plasma, so that the mold layer 48 including the second opening 50 and the node-separated thin layer 52a remain on the substrate 30. Any other process similar or substantially similar to an ashing process may also be used.

The mold layer 48 may be removed from the substrate 30 using the same or substantially the same process as described above with reference to FIG. 3H, so that a plurality of lower electrodes 56, each of which contacts contact pad 46, may be formed on the substrate 30. The mold layer 48 may comprise oxide, so that a wet etching process using an etchant containing water such an LAL solution, which may be a mixture of ammonium fluoride (NH$_4$F), hydrogen fluoride (HF) and water (H$_2$O), may be performed so as to remove the mold layer 48 from the substrate 30.

A cleaning process for removing a residual LAL solution and a dry process performed in an isopropyl alcohol vapor atmosphere may be performed on a resultant structure including the lower electrode 56.

The mold layer 48 may be removed from the substrate 30 by a wet etching process using an etchant containing water such an LAL solution, and foreign matters may accumulate between the lower electrodes 56 in the same or substantially the same way as described above. An increased amount of foreign matters may accumulate between the lower electrodes in performing a pre-cleaning process before the cleaning process.

The foreign matters may be removed from the lower electrode 56 in the same or substantially the same manner as discussed above. For example, the foreign matters may be removed using a dry cleaning process using, for example, hydrogen fluoride gas. Foreign matters may be removed (e.g., sufficiently removed) from the lower electrodes 56 and may be suppressed (e.g., prevented) from re-accumulating between the lower electrodes 56 in the cleaning process. This may improve stability of the lower electrodes 56 of the capacitor 62.

In the same or substantially the same process as described with reference to FIG. 3I, a dielectric layer 58 and an upper electrode may be formed (e.g., sequentially formed) on the lower electrode 56. The capacitor 62 including the lower electrode 56, the dielectric layer 58 and the upper electrode 60 may be formed on the substrate 30.

In at least this example embodiment of the present invention, foreign matters may be removed from the resultant structure including the lower electrode 56 by a dry cleaning process in which water may not be involved thereby improving stability of the cylindrical lower electrode having an increased and/or higher aspect ratio. The capacitor including the lower electrode may have a larger storage capacity and/or increased stability.

Although example embodiments of the present invention have been described, it is understood that the present invention should not be limited to these example embodiments but various changes and modifications may be made by one skilled in the art within the spirit and scope of the present invention as hereinafter claimed.

What is claimed is:

1. A method of forming a capacitor for a semiconductor device, the method comprising:
    forming a mold layer on a substrate, the mold layer including an opening through which the substrate is at least partially exposed;
    forming a thin layer on a surface of the mold layer, a sidewall of the opening and a top surface of the substrate exposed through the opening to form a semiconductor structure;
    forming a sacrificial layer on the semiconductor structure;
    removing the sacrificial layer and the thin layer until the surface of the mold layer is exposed, wherein the sacrificial layer and the thin layer remain in the opening;
    forming a lower electrode from the semiconductor structure by a wet etching process using an etchant;
    removing foreign matter caused by water in the etchant by performing a dry cleaning process using hydrogen fluoride gas on the semiconductor structure;
    forming a dielectric layer on the lower electrode; and
    forming an upper electrode on the dielectric layer,
    wherein forming the lower electrode includes:
        removing a residual sacrificial layer remaining in the opening from the substrate; and
        removing the mold layer from the substrate by the wet etching process using the etchant,
    wherein the dry cleaning process using the hydrogen fluoride gas is performed on the substrate after the residual sacrificial layer and the mold layer are removed from the substrate.

2. The method of claim 1, where in the foreign matter is caused by oxidation of the water in the etchant.

3. The method of claim 1, further comprising before the step of removing the foreign matter;

pre-cleaning the sacrificial layer and the mold layer using a cleaning solution, and drying the sacrificial layer and the mold layer in an isopropyl alcohol vapor atmosphere to remove the cleaning solution from the sacrificial layer and the mold layer, wherein the foreign matter is caused by oxidation of the water in at least one of the etchant and the cleaning solution.

4. The method of claim 1, wherein the mold layer comprises at least oxide.

5. The method of claim 1, wherein the sacrificial layer has an etching rate different from that of the mold layer so that the step of removing the residual sacrificial layer and the step of removing the mold layer are sequentially performed.

6. The method of claim 1, wherein the sacrificial layer comprises a photoresist composition.

7. The method of claim 1, wherein removing the sacrificial layer and the thin layer is performed by a chemical mechanical polishing (CMP) process or an etching process.

8. The method of claim 1, wherein the etchant includes Limulus Amoebocyte Lysate (LAL) solution.

9. The method of claim 1, further comprising before the step of forming the dielectric layer:

pre-cleaning a resultant structure including the lower electrode using a cleaning solution; and drying the resultant structure in an isopropyl alcohol vapor atmosphere to remove the cleaning solution from the resultant structure, wherein the foreign matter is caused by oxidation of the residual water in at least one of the etchant and the cleaning solution.

10. The method of claim 1, wherein the sacrificial layer has an etching rate substantially same as that of the mold layer, so that the step of removing the residual sacrificial layer and the step of removing the mold layer are simultaneously performed by the wet etching process using the etchant.

* * * * *